(12) United States Patent
Blasick et al.

(10) Patent No.: US 10,498,061 B1
(45) Date of Patent: Dec. 3, 2019

(54) COAXIAL CONNECTOR ASSEMBLY

(71) Applicant: TE CONNECTIVITY CORPORATION, Berwyn, PA (US)

(72) Inventors: Francis John Blasick, Halifax, PA (US); Keith Edwin Miller, Manheim, PA (US); Denver Harley Wilson, Palmyra, PA (US); John Eric Hampton, Bainbridge, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/222,192

(22) Filed: Dec. 17, 2018

(51) Int. Cl.
| | |
|---|---|
| *H01R 13/08* | (2006.01) |
| *H01R 13/631* | (2006.01) |
| *H01R 24/50* | (2011.01) |
| *H01R 12/73* | (2011.01) |
| *H01R 12/70* | (2011.01) |

(52) U.S. Cl.
CPC .......... *H01R 13/08* (2013.01); *H01R 12/737* (2013.01); *H01R 13/6315* (2013.01); *H01R 24/50* (2013.01); *H01R 12/7047* (2013.01)

(58) Field of Classification Search
CPC .............. H01R 13/08; H01R 13/6315; H01R 12/7047; H01R 24/50
See application file for complete search history.

(56) References Cited

U.S. PATENT DOCUMENTS

| | | |
|---|---|---|
| 1,034,910 A | 8/1912 | Greenway |
| 1,536,082 A | 5/1925 | Douglas |
| 1,580,879 A | 4/1926 | Evans |
| 1,703,046 A | 2/1929 | Paiste |
| 1,875,378 A | 9/1932 | Hastings |
| 2,000,318 A | 5/1935 | Cannon |
| 2,374,971 A | 5/1945 | Benhander |
| 2,404,682 A | 7/1946 | Baker |
| 2,410,618 A | 11/1946 | Zelov |
| 2,659,872 A | 11/1953 | Gilbert |
| 2,677,811 A | 5/1954 | Anderson et al. |
| 2,801,395 A | 7/1957 | Quackenbush |
| 3,002,175 A | 9/1961 | Bertram et al. |
| 3,128,138 A | 4/1964 | Noschese |

(Continued)

FOREIGN PATENT DOCUMENTS

| | | |
|---|---|---|
| DE | 198 44 281 A1 | 5/2000 |
| EP | 2 354 824 A1 | 8/2011 |

(Continued)

*Primary Examiner* — Briggitte R. Hammond

(57) ABSTRACT

A coaxial connector assembly includes a connector module having a connector body that includes contact cavities extending between a front side and a rear side of the connector body. The connector module has a cover having openings. Coaxial contacts are received in corresponding contact cavities each having a coaxial signal element and outer contact. The outer contact has a cable segment coupled to a coaxial cable and a mating segment. The cable segment has a front section and a rear section having a larger diameter than the front section and located rearward of the cover to receive the cable. The front section passes through the opening into the contact cavity to engage the mating segment. Biasing springs are located between the cover and the mating segment of the coaxial contact to bias the coaxial contact in the mating direction.

26 Claims, 8 Drawing Sheets

(56) References Cited

U.S. PATENT DOCUMENTS

| | | | |
|---|---|---|---|
| 3,177,464 A | 4/1965 | Solorow et al. | |
| 3,266,006 A | 8/1966 | Abbott | |
| 3,277,421 A | 10/1966 | Gobrecht | |
| 3,562,696 A | 2/1971 | Barnhart et al. | |
| 3,566,334 A | 2/1971 | Ziegler, Jr. | |
| 3,668,608 A | 6/1972 | Ziegler, Jr. | |
| 3,671,921 A | 6/1972 | Baker, III et al. | |
| 3,851,946 A | 12/1974 | Piaget et al. | |
| 4,106,834 A | 8/1978 | Horowitz | |
| 4,232,930 A | 11/1980 | Teti | |
| 4,392,699 A | 7/1983 | Weingartner | |
| 4,407,553 A | 10/1983 | Dvorachek et al. | |
| 4,413,875 A | 11/1983 | Mattingly | |
| 4,630,876 A | 12/1986 | Grunberg et al. | |
| 4,659,162 A | 4/1987 | Cartesse | |
| 4,659,164 A | 4/1987 | Reuss | |
| 4,764,130 A | 8/1988 | DiClemente | |
| 4,927,388 A | 5/1990 | Gutter | |
| 4,938,718 A | 7/1990 | Guendel | |
| 4,940,417 A | 7/1990 | Hyogo et al. | |
| 4,944,568 A * | 7/1990 | Danbach | G02B 6/3847 250/227.11 |
| 5,000,693 A | 3/1991 | Hatagishi et al. | |
| 5,192,224 A | 3/1993 | Bernardini | |
| 5,217,386 A | 6/1993 | Ohsumi et al. | |
| 5,217,391 A | 6/1993 | Fisher, Jr. | |
| 5,383,790 A | 1/1995 | Kerek et al. | |
| 5,590,229 A | 12/1996 | Goldman et al. | |
| 5,651,683 A | 7/1997 | Shimamura et al. | |
| 5,671,311 A | 9/1997 | Stillie et al. | |
| 5,689,598 A | 11/1997 | Dean, Jr. et al. | |
| 5,791,939 A | 8/1998 | Tanigawa | |
| 6,485,194 B1 | 11/2002 | Shirakawa | |
| 6,517,380 B1 | 2/2003 | Deutsch | |
| 6,827,597 B1 | 12/2004 | Metzhower et al. | |
| 7,033,211 B2 | 4/2006 | Bartholoma et al. | |
| 7,063,546 B2 | 6/2006 | Akino | |
| 7,070,458 B2 | 7/2006 | Axenbock et al. | |
| 7,234,967 B2 * | 6/2007 | Weidner | H01R 9/0515 439/581 |
| 7,485,012 B2 | 2/2009 | Daugherty et al. | |
| 7,517,234 B2 | 4/2009 | Akino | |
| 7,581,984 B2 | 9/2009 | Moyon et al. | |
| 7,896,655 B1 * | 3/2011 | Blasick | H01R 13/112 439/581 |
| 8,002,574 B1 * | 8/2011 | Yi | H01R 13/582 439/455 |
| 8,066,531 B2 | 11/2011 | Kanatsu | |
| 8,182,297 B2 | 5/2012 | Lin | |
| 8,282,415 B1 * | 10/2012 | Foltz | H01R 13/514 439/579 |
| 8,360,807 B2 | 1/2013 | Buff et al. | |
| 8,758,055 B2 * | 6/2014 | McAlonis | H01R 13/518 439/607.01 |
| 8,851,934 B2 * | 10/2014 | McAlonis | H01R 13/6453 439/680 |
| 9,130,328 B1 | 9/2015 | Huang et al. | |
| 9,160,096 B2 * | 10/2015 | Morley | H01R 13/514 |
| 9,362,638 B2 | 6/2016 | Ljubijankic et al. | |
| 9,368,883 B2 | 6/2016 | Chiang et al. | |
| 9,444,169 B2 | 9/2016 | Gates | |
| 9,608,388 B2 * | 3/2017 | Kondo | H01R 24/38 |
| 9,627,782 B2 | 4/2017 | Fackler | |
| 9,735,519 B2 | 8/2017 | Yi et al. | |
| 10,116,093 B2 | 10/2018 | Ishibashi | |
| 2004/0253869 A1 | 12/2004 | Yamaguchi et al. | |
| 2009/0028495 A1 | 1/2009 | Anrig et al. | |
| 2011/0188810 A1 | 8/2011 | Ciechomski et al. | |
| 2013/0236142 A1 | 9/2013 | Fabian et al. | |
| 2014/0206221 A1 * | 7/2014 | Morley | H01R 13/518 439/370 |
| 2014/0308008 A1 | 10/2014 | Mougin et al. | |
| 2015/0234127 A1 | 8/2015 | Paul Chen et al. | |
| 2016/0116695 A1 | 4/2016 | Nekado et al. | |
| 2017/0170611 A1 | 6/2017 | Yi et al. | |
| 2018/0332726 A1 * | 11/2018 | Zhu | H01R 13/447 |
| 2018/0366844 A1 * | 12/2018 | Beganovic | H01R 9/0515 |
| 2019/0229476 A1 | 7/2019 | Miller et al. | |

FOREIGN PATENT DOCUMENTS

| | | |
|---|---|---|
| WO | 2015/038413 A1 | 3/2015 |
| WO | 2017/100573 A1 | 6/2017 |

* cited by examiner

COAXIAL CONNECTOR ASSEMBLY

BACKGROUND

The subject matter described and/or illustrated herein relates generally to coaxial connector assemblies.

Coaxial connectors are known for interconnecting various coaxial components, such as coaxial cables, circuit boards, and/or the like. Coaxial connectors include one or more coaxial contact pairs. Each coaxial contact pair includes a signal element and a ground element that is arranged coaxially with the signal element. A coaxial contact pair is hereinafter referred to as a coaxial contact. Each coaxial contact may have a cable terminated thereto. Coaxial connectors often include an array of coaxial contacts. The coaxial connectors may be used for a wide variety of applications, such as, but not limited to, radio frequency (RF) interconnections. As one example, a backplane communication system may include a large backplane circuit board that includes one or more windows. Each window is configured to receive a coaxial connector that is also mounted to the backplane circuit board using, for example, hardware. As such, the coaxial connectors are presented along one side of the circuit board for mating with corresponding coaxial connectors of a daughter card assembly or assemblies.

Known coaxial connectors are not without disadvantages. For example, it may be desirable to have coaxial connectors that have a greater density of coaxial contacts. Even with greater densities, however, it may be difficult to mate the opposing coaxial connectors. The desire for increased density of connectors and contacts has lead to smaller diameter connectors and cables. However, the electrical performance of the system may be negatively impacted using smaller diameter cables, particularly in application requiring longer cable lengths. There may be a need to use larger diameter cables in combination with small connectors having small diameter coaxial contacts.

BRIEF DESCRIPTION

In an embodiment, a coaxial connector assembly is provided including a connector module having a connector body that includes contact cavities extending between a front side and a rear side of the connector body. The front side faces in a mating direction along a mating axis. The connector module has a cover coupled to the rear side of the connector body having openings aligned with corresponding contact cavities. A plurality of coaxial contacts are received in corresponding contact cavities. Each coaxial contact has a signal element and an outer contact being coaxial with the signal element and electrically isolated from the signal element by an insulator. The outer contact has a cable segment configured to be coupled to a corresponding coaxial cable and a mating segment presented along the front side of the connector body for engaging corresponding mating contacts of a mating connector. The cable segment has a front section and a rear section. The front section has a smaller diameter than the rear section. The rear section is located rearward of the cover and receiving the cable. The front section passes through the corresponding opening in the cover into the corresponding contact cavity to engage the mating segment to mechanically and electrically connect the cable segment and the mating segment of the outer contact. Biasing springs are coupled to each of the coaxial contacts and are located between the cover and the mating segment of the corresponding coaxial contact to bias the coaxial contact in the mating direction.

In another embodiment, a coaxial connector assembly is provided including a connector module having a connector body that includes contact cavities extending between a front side and a rear side of the connector body. The front side faces in a mating direction along a mating axis. The connector module has a cover coupled to the rear side of the connector body. A plurality of coaxial contacts are received in corresponding contact cavities. Each coaxial contact has a signal element and an outer contact coaxial with the signal element and electrically isolated from the signal element by an insulator. The outer contact has a cable segment configured to be coupled to a corresponding coaxial cable and a mating segment presented along the front side of the connector body for engaging corresponding mating contacts of a mating connector. The cable segment has a front section and a rear section. The front section has a smaller diameter than the rear section. The rear section receives the cable. The front section passes through the cover into the corresponding contact cavity to plug into a bore of the mating segment to mechanically and electrically connect the cable segment and the mating segment of the outer contact. The coaxial cable assembly includes a mounting frame having a mating side and a mounting side that face in opposite directions. The mating side faces in the mating direction. The mounting side is configured to interface with a support wall. The mounting frame defines a passage that extends therethrough between the mating and mounting sides. The passage includes a connector-receiving recess defined by blocking surfaces. The connector receiving recess receives the connector module in a loose fit to permit the connector module to float relative to the mounting frame within a confined space that is defined by the blocking surfaces.

In a further embodiment, a communication system is provided including a mating coaxial connector assembly and a coaxial connector assembly coupled to the mating coaxial connector assembly. The mating coaxial connector assembly includes a mating connector having a mating connector body that includes mating contact cavities extending between a front side and a rear side of the mating connector body. The mating contact cavities hold mating coaxial contacts. Each mating coaxial contact has a mating signal element and a mating outer contact being coaxial with the mating signal element and electrically isolated from the mating signal element by an insulator. The coaxial connector assembly includes a connector module having a connector body that includes contact cavities extending between a front side and a rear side of the connector body. The front side faces in a mating direction along a mating axis. The connector module has a cover coupled to the rear side of the connector body having openings aligned with corresponding contact cavities. A plurality of coaxial contacts are received in corresponding contact cavities. Each coaxial contact has a signal element and an outer contact being coaxial with the signal element and electrically isolated from the signal element by an insulator. The outer contact has a cable segment configured to be coupled to a corresponding coaxial cable and a mating segment presented along the front side of the connector body for engaging corresponding mating contacts of a mating connector. The cable segment has a front section and a rear section. The front section has a smaller diameter than the rear section. The rear section is located rearward of the cover and receiving the cable. The front section passes through the corresponding opening in the cover into the corresponding contact cavity to engage the mating segment to mechanically and electrically connect the cable segment and the mating segment of the outer contact. Biasing springs are coupled to each of the coaxial contacts and are located between the cover and the mating segment of the corresponding coaxial contact to bias the coaxial contact in the mating direction. The biasing springs allow the coaxial contacts to retract into the contact cavities during mating with the mating coaxial contacts.

DETAILED DESCRIPTION

Embodiments set forth herein include coaxial connector assemblies and communication systems that include such coaxial connector assemblies. The communication system may include, for example, a circuit board that is secured to the coaxial connector assembly. In some embodiments, the communication system is a backplane (or midplane) communication system. As used herein, the terms backplane and midplane are used interchangeably and represent a system interface for multiple daughter card assemblies (e.g., line cards or switch cards). In other embodiments, the communication system is a circuit board assembly (e.g., daughter card assembly). One or more embodiments permit a connector module of the connector assembly to float during a mating operation. One or more embodiments enable using a denser grouping of coaxial contacts by permitting the coaxial contacts to be rear-loaded into the connector module. In particular embodiments, the connector module is permitted to float and also enables rear-loading of coaxial contacts. One or more embodiments provide coaxial connector assemblies having a dense array of coaxial contacts. One or more embodiments provide termination of large diameter cables to coaxial contacts. One or more embodiments provide an adapter for coaxial contacts that accommodates large diameter cables and provides a small diameter mating interface.

As used herein, phrases such as "a plurality of [elements]," "a set of [elements]," "an array of [elements]," and the like, when used in the detailed description and claims, do not necessarily include each and every element that a component may have. For instance, the phrase "the connector module having a plurality of coaxial contacts that include [a recited feature]" does not necessarily mean that each and every coaxial contact of the connector module has the recited feature. Instead, only some of the coaxial contacts may have the recited feature and other coaxial contacts of the connector module may not include the recited feature. As another example, the detailed description or the claims may recite that a connector assembly includes "cable assemblies, each of which including a [recited feature]." This phrase does not exclude the possibility that other cable assemblies of the connector assembly may not have the recited feature. Accordingly, unless explicitly stated otherwise (e.g., "each and every cable assembly of the connector module"), embodiments may include similar elements that do not have the same features.

Figure 1:
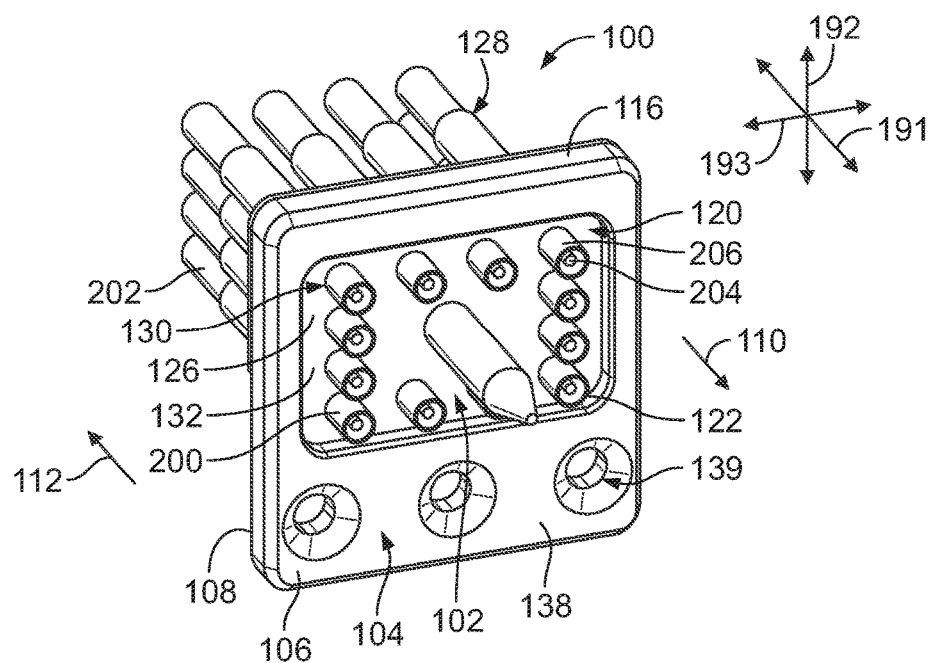
FIG. 1 is a front perspective view of a coaxial connector assembly in accordance with an exemplary embodiment.
Figure 2:
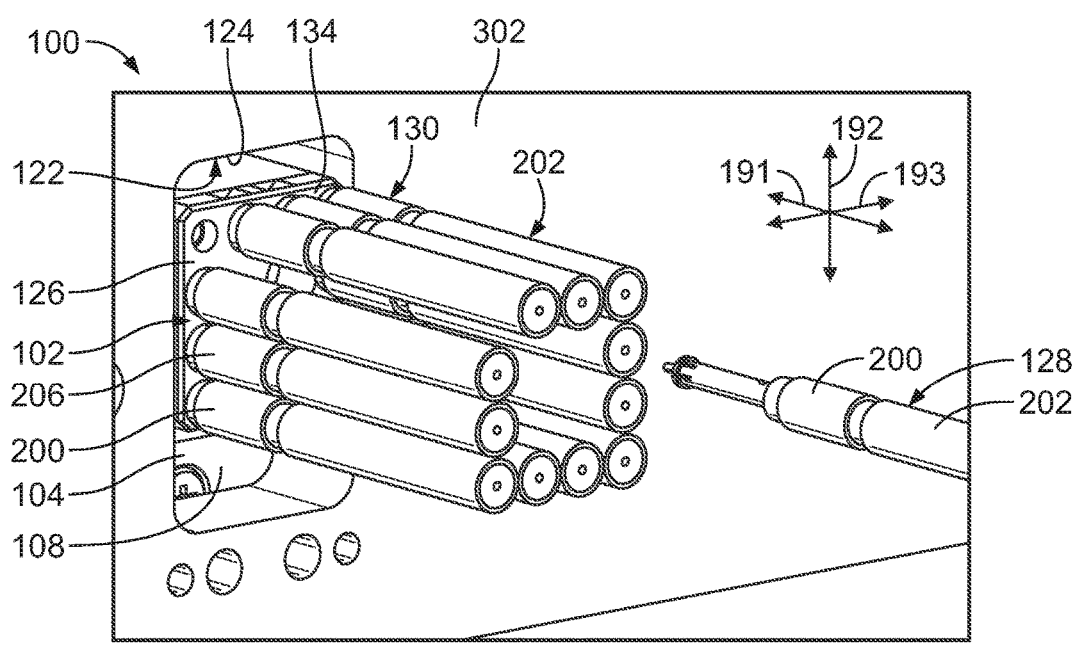
FIG. 2 is a rear perspective view of the coaxial connector assembly in accordance with an exemplary embodiment.

FIG. 1 is a front perspective view of a coaxial connector assembly 100 in accordance with an exemplary embodiment. FIG. 2 is a rear perspective view of the coaxial connector assembly 100 in accordance with an exemplary embodiment. The coaxial connector assembly 100 is configured to mate with a mating coaxial connector assembly 306 (shown in FIG. 3) during a mating operation. However, it should be understood that the coaxial connector assembly 100 may be configured to mate with alternative types of coaxial connectors in other embodiments.

For reference, the coaxial connector assembly 100 is oriented with respect to mutually perpendicular axes 191-193, which includes a mating axis 191, a first lateral axis 192, and a second lateral axis 193. The first and second lateral axes 192, 193 may define a lateral plane. As used herein, if an element moves "laterally" or in a "lateral direction," the movement may be in any direction along the lateral plane. For example, the movement may be parallel to the first lateral axis 192, parallel to the second lateral axis 193, or in a direction with a component along the first lateral axis 192 and a component along the second lateral axis 193. Although the first lateral axis 192 appears oriented parallel to gravity in FIGS. 1 and 2, the coaxial connector assembly 100 may have any orientation with respect to gravity. For simplicity, the coaxial connector assembly 100 is hereinafter referred to as the coaxial connector assembly 100.

The coaxial connector assembly 100 includes a connector module 102 and a mounting frame 104 that are operably coupled to each other. During operation or usage of the coaxial connector assembly 100, a portion of the connector module 102 is floatably held by the mounting frame 104. The coaxial connector assembly 100 may be held between the mounting frame 104 and a support wall 302 (FIG. 2). The support wall 302 may be, for example, a circuit board, panel, or other type of wall. As such, the connector module 102 is permitted to move in a lateral direction during a mating operation. The lateral direction may be any direction that is perpendicular to the mating axis 191 in a plane defined by the first and second lateral axes 192, 193.

The mounting frame 104 includes opposite mating and mounting sides 106, 108. More specifically, the mating side 106 is configured to face in a mating direction 110 along the mating axis 191, and the mounting side 108 is configured to face in a mounting direction 112 along the mating axis 191 that is opposite the mating direction 110. The mounting frame 104 has a thickness that is defined between the mating and mounting sides 106, 108. The mounting frame 104 has an outer frame edge 116 that defines an outer perimeter or border of the mounting frame 104. In the illustrated embodiment, the mounting frame 104 has a substantially rectangular profile that is defined by the outer frame edge 116, but the mounting frame 104 may have profiles with other shapes in alternative embodiments.

Also shown, the mounting frame 104 includes a passage 120 that extends through the mating and mounting sides 106, 108. The passage 120 is sized and shaped to receive a portion of the connector module 102. For example, the mounting frame 104 includes a front edge 122 (FIG. 1) along the mating side 106, and a back edge 124 (FIG. 2) along the mounting side 108. The passage 120 is open at the front edge 122 and the back edge 124. In an exemplary embodiment, the front and back edges 122, 124 have different dimensions in order to position and hold the connector module 102 as described herein. More specifically, the front and back edges 122, 124 are dimensioned to form blocking surfaces (described below) that engage the connector module 102 and prevent the connector module 102 from passing freely through the passage 120. The blocking surfaces may also prevent the connector module 102 from moving laterally beyond a confined space. Optionally, the back edge 124 is dimensioned to allow the passage 120 to receive the connector module 102 therethrough.

The connector module 102 includes a connector body 126 having a front side 132 (FIG. 1) and a rear side 134 (FIG. 2) that face in the mating direction 110 and the mounting direction 112, respectively. The connector module 102 also includes a contact array 130 of coaxial contacts 200 that are coupled to the connector body 126. The connector body 126 holds the coaxial contacts 200 at designated positions for engaging corresponding mating coaxial contacts 326 (shown in FIG. 3). In the illustrated embodiment, the coaxial contacts 200 are elements of corresponding coaxial cable assemblies 128. The coaxial contacts 200 are terminated to ends of cables 202. The coaxial contacts 200 represent mating ends of the corresponding coaxial cable assemblies 128. In an exemplary embodiment, each coaxial contact 200 has a step down in diameter from the cable end to the mating end to accommodate a large diameter cable while having a smaller diameter mating interface. For example, the spacing between the center conductor of the cable and the outer conductor (for example, cable shield) of the cable is greater than the spacing between the center conductor and the outer conductor of the coaxial contact 200 at the mating interface.

Each of the coaxial contacts 200 includes a signal element 204 (FIG. 1) and an outer contact 206 defining a ground element that is coaxially aligned with the signal element 204. The signal element 204 and the outer contact 206 are electrically coupled to signal and ground paths (not shown) through the cable 202. The signal element 204 may be crimped to a center conductor of the cable 202, soldered to a center conductor of the cable 202, press-fit onto a center conductor of the cable 202, or otherwise mechanically and electrically connected to the center conductor of the cable 202. The outer contact 206 may be crimped to a cable shield of the cable 202, soldered to a cable shield of the cable 202, press-fit onto a cable shield of the cable 202, or otherwise mechanically and electrically connected to the cable shield of the cable 202.

The mounting frame 104 may include a frame extension 138. The frame extension 138 represents a section of the mounting frame 104 that extends laterally away from the passage 120. The frame extension 138 is configured to interface with the support wall 302 (FIG. 2). The frame extension 138 includes one or more thru-holes 139 that are sized and shaped to receive hardware (e.g., screws, bolts, plugs, and the like) for securing the mounting frame 104 to the support wall 302. The mounting frame 104 is configured to have a fixed position relative to the support wall 302. The connector module 102, on the other hand, is permitted to float relative to the support wall 302 within a confined space defined by the mounting frame 104.

Figure 3:
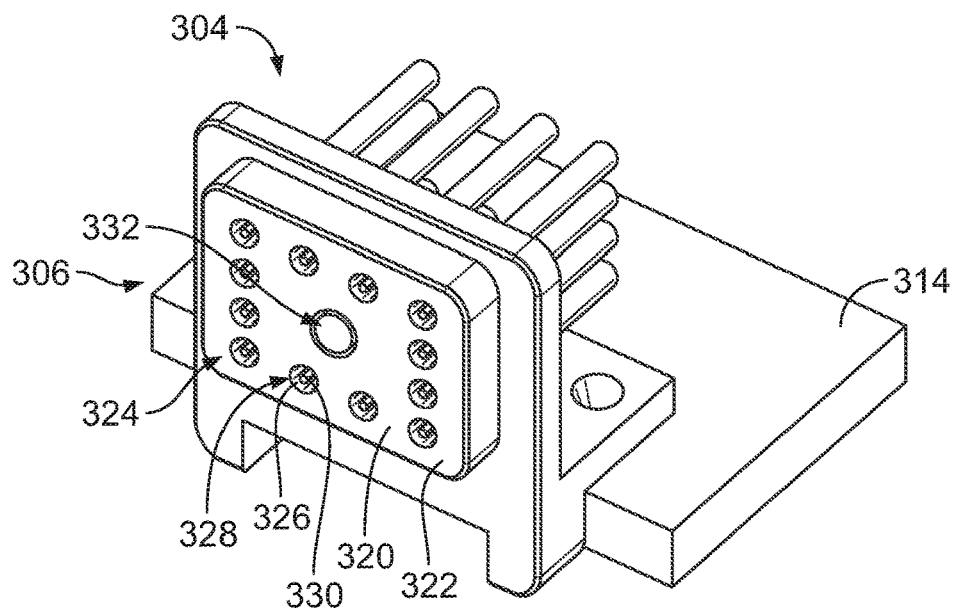
FIG. 3 is a front perspective view of a mating coaxial connector assembly in accordance with an exemplary embodiment.
Figure 4:
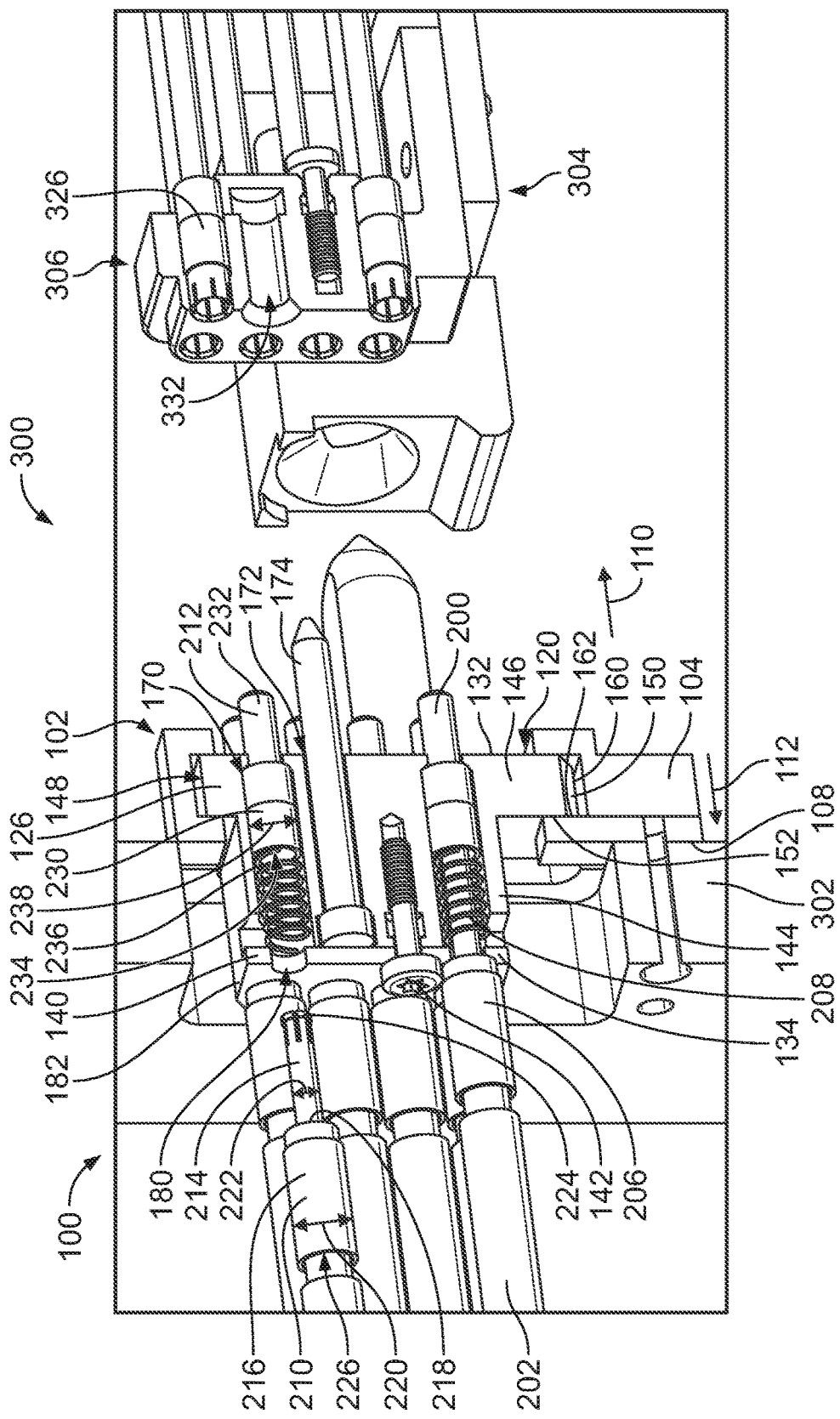
FIG. 4 is a partial sectional view of the coaxial connector assembly and the mating coaxial connector assembly in accordance with an exemplary embodiment forming a communication system.

FIG. 3 is a front perspective view of the mating coaxial connector assembly 306 in accordance with an exemplary embodiment. In an exemplary embodiment, the mating coaxial connector assembly 306 is configured to be coupled to a daughter card 314 (FIG. 4) to form a daughter card assembly 304 (FIG. 4). In other embodiments, however, the mating coaxial connector assembly 306 may not be part of a daughter card assembly. The mating coaxial connector assembly 306 includes a mating connector body 320 having a front side 322 and a two-dimensional contact array 324 of mating coaxial contacts 326. The mating coaxial contacts 326 have receiving cavities 328 that are sized and shaped to receive portions of corresponding coaxial contacts 200 (FIG. 1). The mating coaxial contacts 326 include signal pins 330 disposed in the receiving cavities 328 that are configured to engage the signal elements 204 (FIG. 1) of the corresponding coaxial contacts 200. Also shown, the front side 322 includes alignment cavities 332. The alignment cavities 332 are configured to receive corresponding alignment features of the coaxial connector assembly 100 (FIG. 1).

FIG. 4 is a partial sectional view of the coaxial connector assembly 100 and the mating coaxial connector assembly 306 in accordance with an exemplary embodiment forming a communication system 300. The coaxial connector assembly 100 is mounted to the support wall 302, such as in line with an opening in the support wall 302 to allow the connector module and/or the cables 202 to pass therethrough.

In an exemplary embodiment, the coaxial connector assembly 100 is configured to engage the daughter card assembly 304 to form a backplane communication system. In some applications, the daughter card assembly 304 may be referred to more generally as a circuit board assembly. The communication system 300 may be configured for radiofrequency (RF) applications. In particular embodiments, the communication system 300 and/or its components, such as the coaxial connector assembly 100, are configured to satisfy military and aerospace applications. For example, the components of the communication system 300 may be configured to satisfy one or more industry or government standards, such as MIL-STD-348. To illustrate one example of the communication system 300, the coaxial connector assembly 100 and the daughter card assembly 304 may form an interconnect between analog and digital sections of a radio. The daughter card assembly 304 may perform analog functions. The daughter card assembly 304 may be replaced with other daughter card assemblies that are configured to perform the same or different operations. The digital functions, including digital signal processing, may be performed by a communication component (not shown) that is coupled to the coaxial connector assembly 100. The other communication component may be another daughter card assembly (not shown).

The communication system 300 and/or its components (e.g., the coaxial connector assembly 100) may be configured to satisfy one or more industry or government standards. By way of example only, embodiments may be configured to satisfy the VME International Trade Association (VITA) standards (e.g., VITA 48, VITA 67, et al.). The communication system 300 and/or its components may have an operating speed that achieves 50 GHz or greater. In particular embodiments, the communication system 300 and/or its components may achieve an operating speed of 60 GHz or greater. It should be understood, however, that other embodiments may be configured for different standards and may be configured to operate at different speeds. In some configurations, embodiments may be configured to operate within the range of DC to 60.0 GHz.

The coaxial connector assembly 100 and the mating coaxial connector assembly 306 are shown in section to illustrate the various components of the assemblies. The connector module 102 includes the connector body 126 and a cover 140. In an exemplary embodiment, the connector body 126 and the cover 140 are discrete elements that are configured to be secured to each other. In the illustrated embodiment, the connector body 126 and the cover 140 are secured to each other using hardware 142 (e.g., screws), but may be secured to each other in other manners in alternative embodiments. The connector body 126 includes a main portion 144 and a flange portion 146 that extends laterally (or radially) away from the main portion 144. The flange portion 146 includes a flange edge 150 and a rearward-facing surface 152. The rearward-facing surface 152 faces in the mounting direction 112. The flange edge 150 faces radially away from the connector body 126.

The mounting frame 104 includes a connector-receiving recess 148 of the passage 120 that opens along the mounting side 108. The connector-receiving recess 148 is sized and shaped to receive the flange portion 146 of the connector body 126. The connector-receiving recess 148 is defined by first and second blocking surfaces 160, 162. The first and second blocking surfaces 160, 162 are sized and shaped relative to receive the flange portion 146 therebetween. The first and second blocking surfaces 160, 162 are configured to engage the connector module 102 and hold the connector module in the mounting frame 104. In an exemplary embodiment, the connector-receiving recess 148 is oversized relative the flange portion 146 to permit the connector module 102 to float relative to the mounting frame 104. In particular embodiments, the first and second blocking surfaces 160, 162 contain the connector module 102 in the connector receiving recess 148 and permit the connector module 102 to float at least 0.15 mm along a lateral plane. For example, the flange edge 150 may be spaced apart from the outer edge of the connector receiving recess 148 allowing the flange portion 146 to float in the connector receiving recess 148. In alternative embodiments, the mounting frame 104 may be provided without the second blocking surface 162, rather using the support wall 302 to capture the flange portion 146 in the connector receiving recess 148.

The connector module 102 includes a plurality of contact cavities 170 extending between the front side 132 and the rear side 134. The contact cavities 170 receive corresponding coaxial contacts 200. The cover 140 includes a plurality of openings 180. The openings 180 are configured to receive corresponding coaxial contacts 200. When the connector body 126 and the cover 140 are coupled to each other, the contact cavities 170 of the connector body 126 and the openings 180 of the cover 140 align with each other.

The cover 140 also includes an outer section edge 182 that faces radially or laterally away from the cover 140. In some embodiments, as shown in FIG. 4, the openings 180 may open to the outer section edge 182. More specifically, the openings 180 may be defined by open-sided slots that provide access to the openings 180. The open-sided slots are sized and shaped to receive portions of the coaxial contacts 200.

In the illustrated embodiment, the connector body 126 also includes alignment channels 172 that extend entirely through the connector body 126. The alignment channels 172 are configured to receive alignment posts 174 that are configured to clear the front side 132 and the passage 120 and project away from the mounting frame 104 in the mating direction 110. The alignment posts 174 are configured to be received in corresponding alignment cavities 332 of the mating coaxial connector assembly 306 during the mating operation.

In an exemplary embodiment, the coaxial connector assembly 100 includes a biasing spring 208 coupled to the corresponding coaxial contacts 200. The biasing spring 208 engages the cover 140 and engages the coaxial contact 200 to bias the coaxial contact in the mating direction. A portion of the coaxial contact 200 passes through the biasing spring 208. For example, the biasing spring 208 is coaxial with and outward of a portion of the coaxial contact 200.

In an exemplary embodiment, the outer contact 206 of each coaxial contact 200 is manufactured from multiple contact pieces assembled and/or mated together to form an outer conductor extending between the cable 202 and the mating interface configured to be mated with the mating coaxial contact 326. The outer contact 206 has a cable segment 210 configured to be coupled to the corresponding coaxial cable 202 and a mating segment 212 presented along the front side 132 of the connector body 126 for engaging the corresponding mating coaxial contact 326 of the mating coaxial connector assembly 306. The cable segment 210 is separate and discrete from the mating segment 212 and is configured to be mated thereto. For example, the cable segment 210 is configured to be plugged into the mating segment 212 to mechanically and electrically connect the cable segment 210 to the mating segment 212.

The cable segment 210 includes a front section 214 and a rear section 216. The cable segment 210 has a shoulder 218 defined between the front section 214 and the rear section 216. The shoulder 218 is configured to abut against the cover 140 to position the coaxial contact 200 relative to the connector module 102. The rear section 216 is located rearward of the cover 140 and receives the cable 202. The front section 214 is smaller than the rear section 216. For example, the rear section 216 has a first diameter 220 and the front section 214 has a second diameter 222. The second diameter 222 is smaller than the first diameter 220. The rear section 216 has the enlarged diameter to receive the large diameter cable 202. For example, the rear section 216 includes a cable bore 226 at the rear end of the rear section 216 that receives the end of the cable 202. The front section 214 extends to a plug end 224 at a front of the front section 214. The plug end 224 is configured to be plugged into the mating segment 212. The front section 214 is sized to fit through the corresponding opening 180 in the cover 140 to extend into the contact cavity 170. For example, the front section 214 has the reduced diameter compared to the rear section 216 to pass through the biasing spring 208 and to mate with the mating segment 212.

The mating segment 212 includes a front section 230 and a rear section 232. Optionally, the front section 230 may be separate and discrete from the rear section 232 and coupled thereto to form the mating segment 212. Alternatively, the front section 230 and the rear section 232 may be integral as part of a unitary structure. The front section 230 extends forward of the front side 132 of the connector module 102. The front section 230 extends forward of the front side 132 for mating with the mating coaxial contact 326. The rear section 232 includes a bore 234 at a rear end 236 thereof. The bore 234 receives the plug end 224 of the cable segment 210 to mechanically and electrically connect the cable segment 210 to the mating segment 212. In an exemplary embodiment, the front end of the biasing spring 208 engages the rear end 236 of the mating segment 212. For example, the biasing spring may have a similar diameter as the rear end 236 of the mating segment 212. Optionally, the rear end 236 has a third diameter 238 approximately equal to the diameter of the contact cavity 170. In an exemplary embodiment, the third diameter 238 is larger than the second diameter 222. For example, the rear section 232 may surround the bore 234 that receives the plug end 224 of the front section 214 of the cable segment 210. The front section 214, having the second diameter 222, is smaller than the rear section 232 of the mating segment 212 such that the plug end 224 may be received in the bore 234 of the mating segment 212. Optionally, the mating segment 212 may be free to move within the contact cavity 170, such as when mating with the mating coaxial contact 326. For example, the mating segment 212 may float rearward against the spring bias of the biasing spring 208 when mated with the mating coaxial contact 326. The biasing spring 208 may be partially compressed between the rear end 236 of the mating segment 212 and the cover 140.

Figure 5:
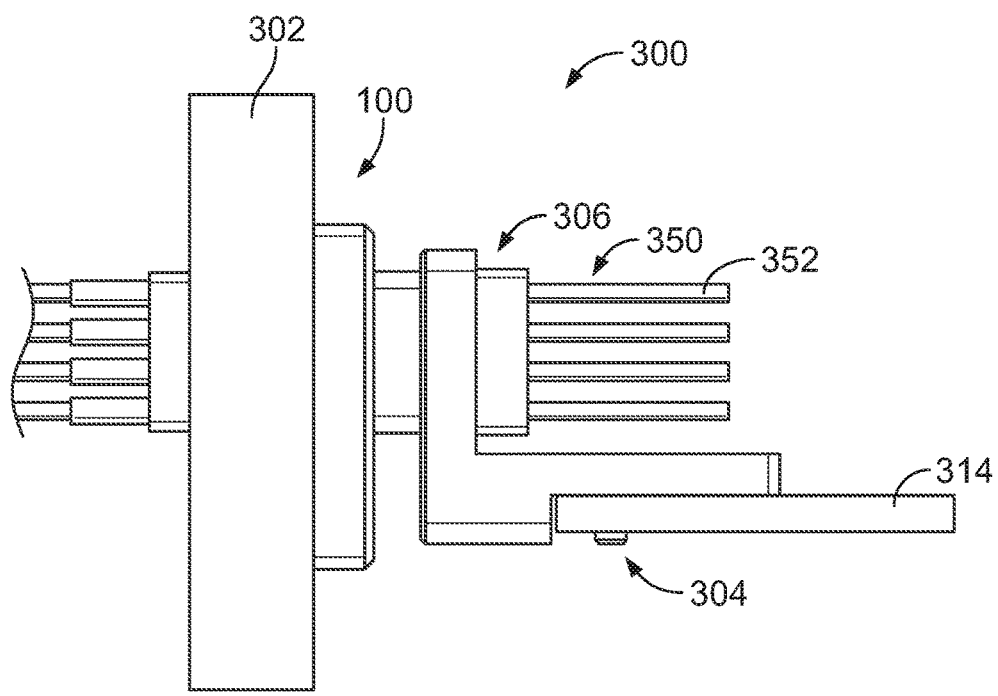
FIG. 5 is a side view of the communication system in accordance with an exemplary embodiment showing the coaxial connector assembly coupled to the mating coaxial connector assembly.

FIG. 5 is a side view of the communication system 300 showing the coaxial connector assembly 100 coupled to the mating coaxial connector assembly 306. The coaxial connector assembly 100 is shown mounted to the support wall 302. In various embodiments, a daughter card 314 of the daughter card assembly 304 is oriented orthogonal or perpendicular to the support wall 302. The daughter card assembly 304 includes cable assemblies 350 that each include a cable 352 configured to be terminated to corresponding mating coaxial contacts 326. In alternative embodiments, the daughter card assembly 304 does not include the cables 352 that directly couple to the coaxial contacts 326. Rather, the coaxial contacts 326 may be electrically coupled directly to the daughter card 314.

Figure 6:
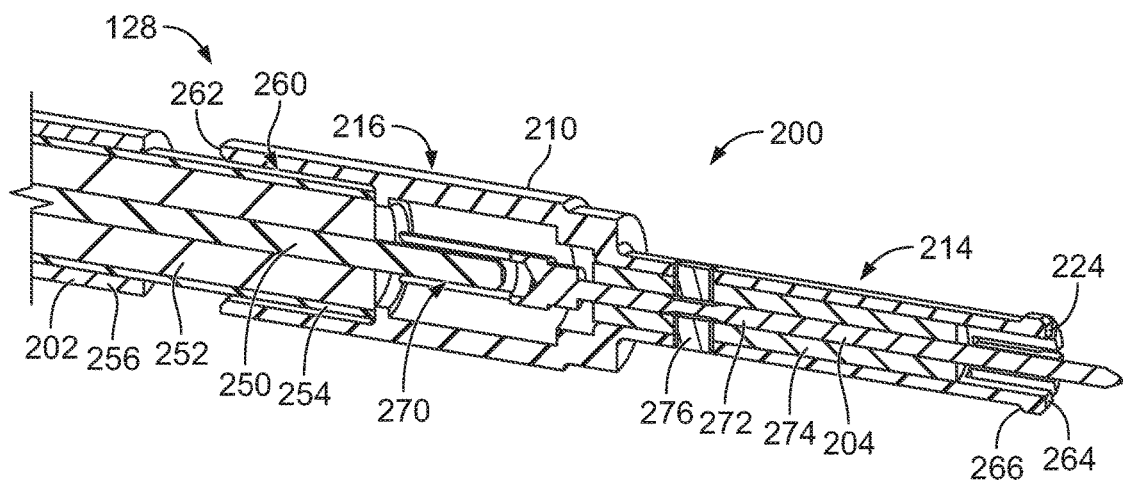
FIG. 6 is a cross-sectional view of a portion of the coaxial connector assembly in accordance with an exemplary embodiment showing a cable coupled to a cable segment of a coaxial contact.

FIG. 6 is a cross-sectional view of a portion of the coaxial connector assembly 100 showing the cable 202 coupled to the cable segment 210 of the coaxial contact 200. In an exemplary embodiment, the cable 202 includes a center conductor 250, an insulator 252 holding the center conductor 250, an outer conductor defined by a cable shield 254 surrounding the insulator 252, and a jacket 256 surrounding the cable shield 254.

The rear section 216 of the cable segment 210 is terminated to the cable shield 254 of the cable 202. For example, the rear section 216 includes a bore 260 at a rear end 262 of the rear section 216. The bore 260 receives the end of the cable 202. The cable segment 210 may be crimped to the cable shield 254. In other various embodiments, the cable segment 210 may be soldered to the cable shield 254. In other various embodiments, the cable segment 210 may be terminated by other means to the cable shield 254. As such, the outer contact is electrically commoned with the cable shield 254 of the cable 202. In an exemplary embodiment, the cable segment 210 includes a deflectable coupling beams 264 at the plug end 224 of the cable segment 210. The coupling beams 264 include lips 266 around outer edges of the coupling beams 264. The coupling beams 264 are configured to be plugged into the mating segment 212. The lips 266 are configured to engage the mating segment 212 to hold the cable segment 210 in the mating segment 212.

The signal element 204 passes through the cable segment 210. The signal element 204 is terminated to the center conductor 250. For example, the signal element 204 includes a bore 270 receiving the center conductor 250. The signal element 204 may be soldered or crimped to the center conductor 250. In the illustrated embodiment, the signal element 204 includes a pin 272 opposite the bore 270. The pin 272 extends through the front section 214 of the cable segment 210. The insulator 274 electrically isolates the signal element 204 from the cable segment 210. The insulator 274 supports the pin 272. In an exemplary embodiment, epoxy 276 may fill a hole in the cable segment 210 and the insulator 274 to engage and secure the insulator 274 and the pin 272 in the cable segment 210.

Figure 7:
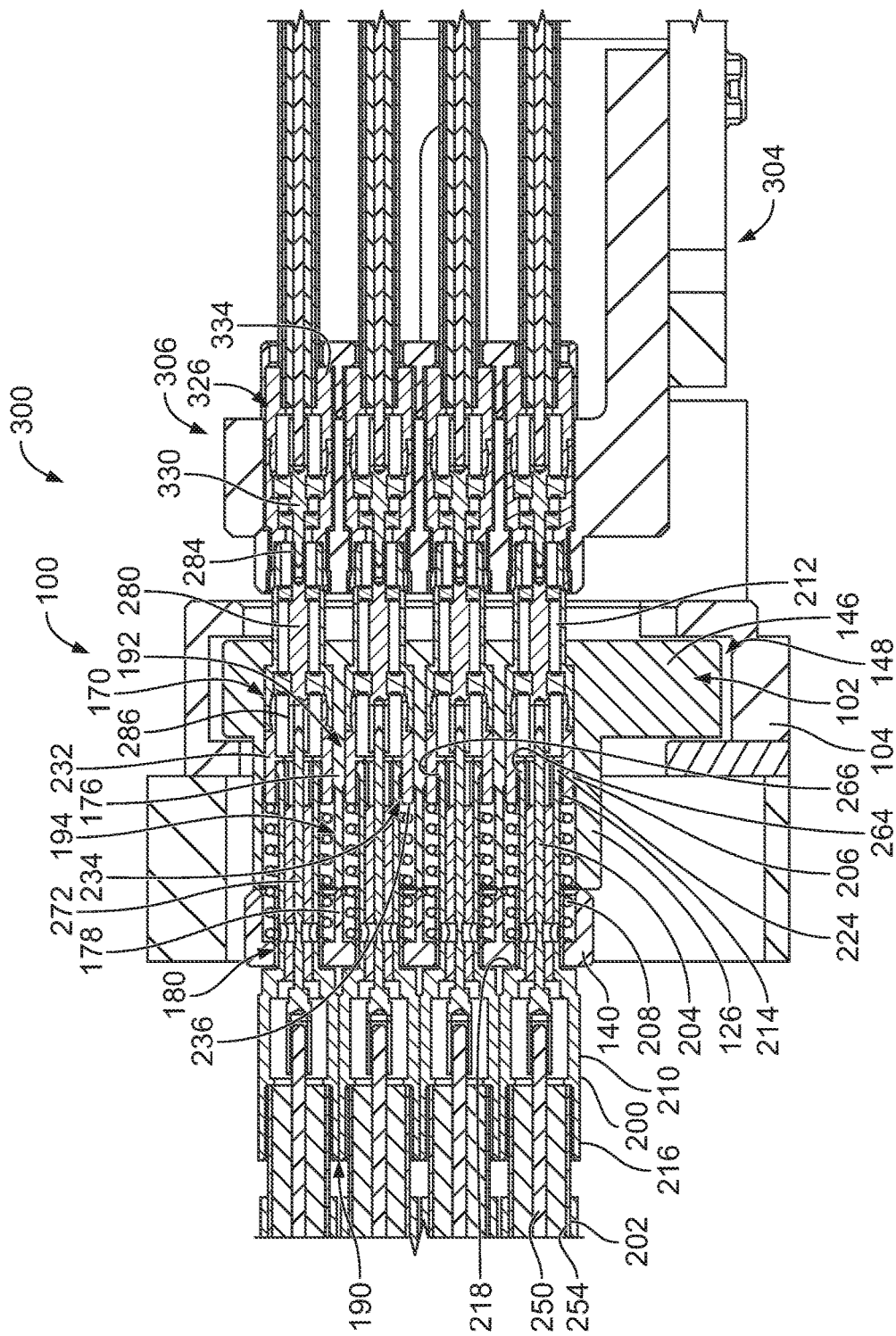
FIG. 7 is a cross-section of the communication system in accordance with an exemplary embodiment showing the coaxial connector assembly mated with a daughter card assembly.

FIG. 7 is a cross-section of the communication system 300 showing the coaxial connector assembly 100 mated with the daughter card assembly 304. The mounting frame 104 defines a confined space for the connector module 102, such as at the connector-receiving recess 148. The flange portion 146 of the connector module 102 is able to move in a lateral plane perpendicular to the mating axis to align the connector module 102 relative to the mating coaxial connector assembly 306. For example, the alignment posts 174 may align the connector body 126 with the mating coaxial connector assembly 306 such that the coaxial contacts 200 are aligned with and configured to be mated with the corresponding mating coaxial contacts 326.

When assembled, the cable segment 210 is mechanically and electrically connected to the mating segment 212. The front section 214 of the cable segment 210 extends through the corresponding opening 180 in the cover 140 to mate with the mating segment 212, which is spaced apart from the cover 140. The front section 214 passes through the biasing spring 208 such that the plug end 224 is received in the bore 234 at the rear end 236 of the mating segment 212. The lips 266 of the coupling beams 264 are received in pockets formed in the bore 234 to hold the plug end 224 of the cable segment 210 in the bore 234 of the mating segment 212. The biasing spring 208 is compressed between the rear end 236 of the mating segment 212 and the cover 140. In an exemplary embodiment, when the cable segment 210 is fully loaded into the connector body 126, the shoulder 218 abuts against the back end of the cover 140. For example, the biasing spring 208 may pull the cable segment 210 forward until the shoulder 218 abuts against the cover 140.

In an exemplary embodiment, the connector body 126 includes walls 176 between corresponding contact cavities 170 and the cover 140 includes corresponding walls 178. The coaxial contacts 200 are arranged in a row. The walls 176, 178 separate adjacent coaxial contacts 200 from each other. In an exemplary embodiment, the rear sections 216 of the cable segments 210 of the coaxial contacts 200 in the row have a first spacing 184. The front sections 214 of the cable segments 210 of the coaxial contacts 200 in the row have a second spacing 186. The rear ends 236 of the rear sections 232 of the mating segments 212 of the coaxial contacts 200 and the row have a third spacing 188. The second spacing 186 is greater than the first spacing 184 and the third spacing 188. Optionally, the third spacing 188 is greater than the first spacing 184. Optionally, the first spacing 184 may be zero or near zero such that the rear sections 216 of the cable segments 210 abuts against or nearly abut against each other. By oversize in the rear sections 216 of the cable segments 210, the coaxial contacts 200 may accommodate large diameter cables 202. For example, the diameter of the cables may be selected such that there is near zero spacing between the cables. Utilizing large diameter cables 202 allows large spacing between the cable shield 254 and the center conductor 250 to enhance electrical performance of the cables 202, such as for long electrical paths from the coaxial connector assembly 100 to another electrical component. The third spacing 188 may be selected to be approximately equal to a thickness of the walls 176 between the contact cavities 170. For example, the mating segment 212 may slide along the walls 176 as the coaxial contact 200 floats within the connector body 126. The walls 176 are located in the third spacing 188 between the adjacent coaxial contacts 200. The second spacing 186 is larger than the third spacing 188 to accommodate the walls 176, 178 and the biasing springs 208. For example, the second diameter 222 of the front section 214 of the cable segment 210 of the coaxial contact 200 is smaller than the diameter of the biasing spring 208 such that the front section 214 may be loaded through the biasing spring 208 to mate with the mating segment 212.

In an exemplary embodiment, the signal element 204 includes a mating signal element 280 in the mating segment 212. In the illustrated embodiment, the mating signal element 280 is a double ended socket having a front socket 282 and a rear socket 284. The rear socket 284 receives the pin 272 of the signal element 204. The mating signal element 280 is held by an insulator 286 and electrically isolates the signal element 204 from the outer contact 206. The front socket 282 is configured to be mated with the signal pin 330 of the mating coaxial contact 326. Other types of mating interfaces may be provided in alternative embodiments.

In an exemplary embodiment, the mating of the coaxial contacts 200, 326 is configured to occur at a predetermined sequence such that the outer contacts 206 engage corresponding outer contacts 334 of the mating coaxial contacts 326 prior to the signal elements 204 engaging the signal pins 330 of the mating coaxial contacts 326. During the mating operation, forces applied by the mating coaxial contacts 326 to the coaxial contacts 200 may cause the connector module 102 to float and/or rotate to more precisely align the coaxial contacts 200, 326. Forces applied by the mating coaxial contacts 326 to the coaxial contacts 200 may cause the coaxial contacts 200 to move rearwardly against the spring bias of the biasing springs 208. The biasing springs 208 allow the coaxial contacts 200 to float within the contact cavities 170. The biasing force of the biasing springs 208 is configured to hold the corresponding coaxial contact 200 in a forward position to assure that the corresponding coaxial contact 200 engages the corresponding mating coaxial contact 326 of the mating coaxial connector assembly 306 to form a sufficient connection. The biasing force may facilitate maintaining a sufficient electrical connection between the coaxial contacts 200 and the mating coaxial contacts 326. For example, in some environments, the communication system 300 may experience shock, vibration, and/or extreme temperatures that may cause deformation, movement, and/or creepage among different elements. The biasing force may lengthen or improve the lifetime operability of the communication system 300.

Figure 8:
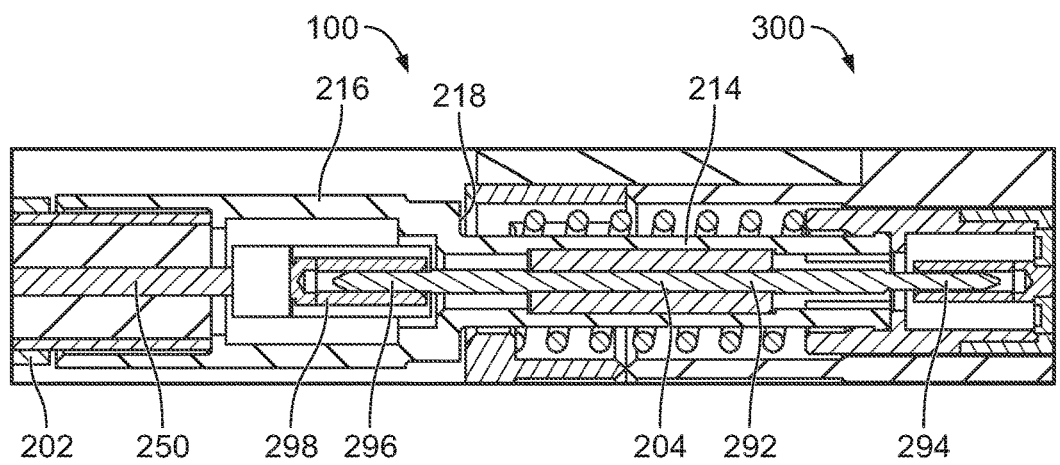
FIG. 8 is a cross section of a portion of the communication system in accordance with an exemplary embodiment showing a portion of the coaxial connector assembly.

FIG. 8 is a cross section of a portion of the communication system 300 showing a portion of the coaxial connector assembly 100. FIG. 8 illustrates the cable segment 210 as a split piece or multi-piece component. The front section 214 is separate and discrete from the rear section 216. The front section 214 is mechanically and electrically connected to the rear section 216, such as by a crimp connection, a soldered connection, a press-fit connection, and the like. In the illustrated embodiment, the rear end of the front section 214 forms part of the shoulder 218. In an exemplary embodiment, the signal element 204 includes a double ended pin 292 having a front pin 294 and a rear pin 296. The rear pin 296 is plugged into a socket 298 applied to the end of the center conductor 250 of the cable 202. For example, the socket 298 may be soldered to the center conductor 250 to receive the rear pin 296.

Figure 9:
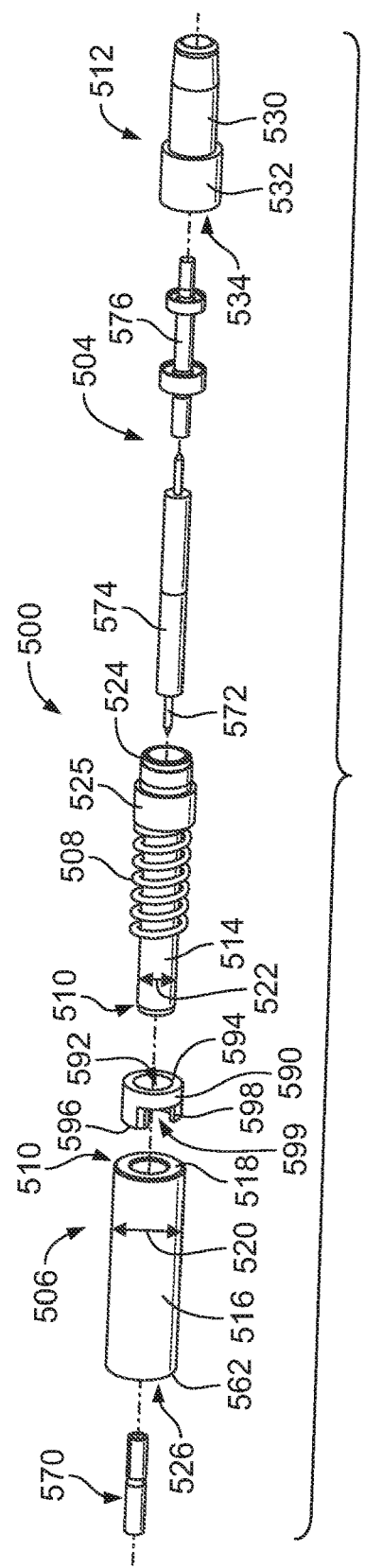
FIG. 9 is an exploded view of a coaxial contact in accordance with an exemplary embodiment.
Figure 10:
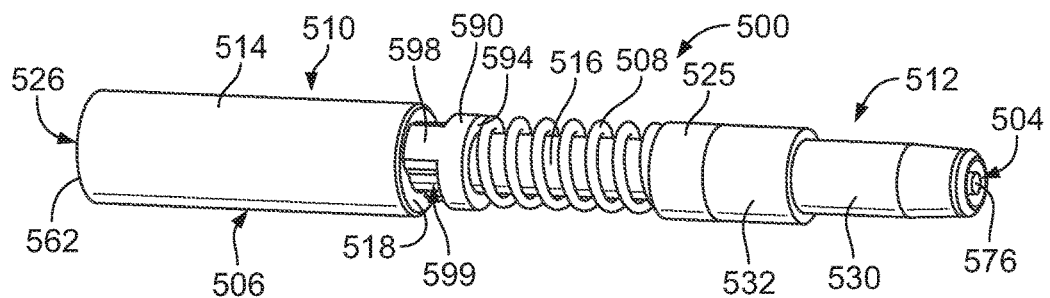
FIG. 10 is an assembled view of the coaxial contact in accordance with an exemplary embodiment.

FIG. 9 is an exploded view of a coaxial contact 500 in accordance with an exemplary embodiment. FIG. 10 is an assembled view of the coaxial contact 500 in accordance with an exemplary embodiment. The coaxial contact 500 is similar to the coaxial contact 200 (shown in FIG. 4) and may be used in place of the coaxial contact 200 in the coaxial connector assembly 100. The coaxial contact 500 is configured to be mated to the corresponding mating coaxial contact 326 (shown in FIG. 3) of the mating coaxial connector assembly 306 (shown in FIG. 3) during a mating operation. However, it should be understood that the coaxial contact 500 may be configured to mate with alternative types of mating contacts in other embodiments.

The coaxial contact 500 includes a signal element 504 and an outer contact 506 defining a ground element that is coaxially aligned with the signal element 504. The signal element 504 and the outer contact 506 are electrically coupled to signal and ground paths (not shown) through the cable 202 (shown in FIG. 1). A biasing spring 508 is coupled to the coaxial contact 500. The biasing spring 508 engages the coaxial contact 500 to bias the coaxial contact 500 in a mating direction. A portion of the coaxial contact 500 passes through the biasing spring 508. For example, the biasing spring 508 is coaxial with and outward of a portion of the coaxial contact 500.

In an exemplary embodiment, the outer contact 506 of each coaxial contact 500 is manufactured from multiple contact pieces assembled and/or mated together to form an outer conductor extending between the cable 202 and the mating interface configured to be mated with the mating coaxial contact 326. The outer contact 506 has a cable segment 510 configured to be coupled to the corresponding coaxial cable 202 and a mating segment 512 presented along the front side 132 of the connector body 126 for engaging the corresponding mating coaxial contact 326 of the mating coaxial connector assembly 306. The cable segment 510 is separate and discrete from the mating segment 512 and is configured to be mated thereto. For example, the cable segment 510 is configured to be plugged into the mating segment 512 to mechanically and electrically connect the cable segment 510 to the mating segment 512.

The cable segment 510 includes a front section 514 and a rear section 516. In the illustrated embodiment, the front section 514 and the rear section 516 are discrete pieces coupled together to mechanically and electrically connect the front and rear sections 514, 516. In other embodiments, the front and rear sections 514, 516 are integral as a unitary, single piece. The cable segment 510 has a shoulder 518 defined between the front section 514 and the rear section 516. In the illustrated embodiment, the shoulder 518 is defined by the front face of the rear section 516. The shoulder 518 is configured to abut against the cover 140 (shown in FIG. 13) to position the coaxial contact 500 relative to the connector module 102 (shown in FIG. 13).

The rear section 516 is located rearward of the cover 140 and receives the cable 202. The front section 514 is smaller than the rear section 516. For example, the rear section 516 has a first diameter 520 and the front section 514 has a second diameter 522. The second diameter 522 is smaller than the first diameter 520. The rear section 516 has the enlarged diameter to receive the large diameter cable 202. For example, the rear section 516 includes a cable bore 526 at the rear end of the rear section 516 that receives the end of the cable 202. The front section 514 extends to a plug end 524 at a front of the front section 514. The plug end 524 is configured to be plugged into the mating segment 512. In an exemplary embodiment, the front section 514 includes a flange 525 proximate to the front end of the front section 514. The flange 525 defines a seat for the biasing spring 508.

The mating segment 512 includes a front section 530 and a rear section 532. Optionally, the front section 530 and the rear section 532 may be integral as part of a unitary structure. Alternatively, the front section 530 may be separate and discrete from the rear section 532 and coupled thereto to form the mating segment 512. The front section 530 is configured for mating with the mating coaxial contact 326. The rear section 532 includes a bore 534 that receives the plug end 524 of the cable segment 510 to mechanically and electrically connect the cable segment 510 to the mating segment 512.

The rear section 516 of the cable segment 510 is configured to be terminated to the cable 202 (shown in FIG. 6), such as the cable shield of the cable 202. For example, the rear section 516 includes a bore at a rear end 562 of the rear section 516 that receives the end of the cable 202. The cable segment 510 may be crimped to the cable shield. In other various embodiments, the cable segment 510 may be soldered to the cable shield. In other various embodiments, the cable segment 510 may be terminated by other means to the cable shield.

The signal element 504 passes through the cable segment 510. The signal element 504 is terminated to a center conductor of the cable 202. For example, the signal element 504 includes a socket 570 having a bore configured to receive the center conductor. The signal element 504 may be soldered or crimped to the center conductor. In the illustrated embodiment, the signal element 504 includes a pin 572 configured to be plugged into the socket 570. The pin 572 extends through the front section 514 of the cable segment 510 and may be loaded into the rear section 516 to mate with the socket 570. An insulator 574 electrically isolates the signal element 504 from the cable segment 510. The insulator 574 supports the pin 572. In an exemplary embodiment, the signal element 504 includes a mating socket 576 received in the mating segment 512. The mating socket 576 is configured to be coupled to the pin 572. The mating socket 576 is configured to be coupled to the mating coaxial contact 326.

Figure 11:
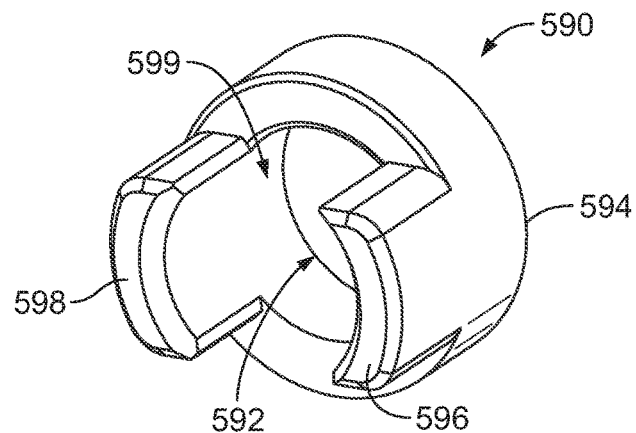
FIG. 11 is a rear perspective view of a washer of the coaxial contact in accordance with an exemplary embodiment.

With additional reference to FIG. 11, which is a rear perspective view of a washer of the coaxial contact 500. The washer 590 is configured to be coupled to the cable segment 510. For example, the washer 590 may be coupled to the front section 514. The washer 590 may be slidably coupled to the cable segment 510. The washer 590 includes a bore 592 that extends between a front 594 and a rear 596. The bore 592 receives the front section 514. The front 594 faces the biasing spring 508. The front 594 defines a seat for the biasing spring 508. The biasing spring 508 is compressible between the front 594 of the washer 590 and the flange 525. The washer 590 includes tabs 598 at the rear 596 that are separated by gaps 599. The tabs 598 are configured to engage the cover 140 (shown in FIG. 12) to locate the washer 590 relative to the cover 140.

Figure 12:
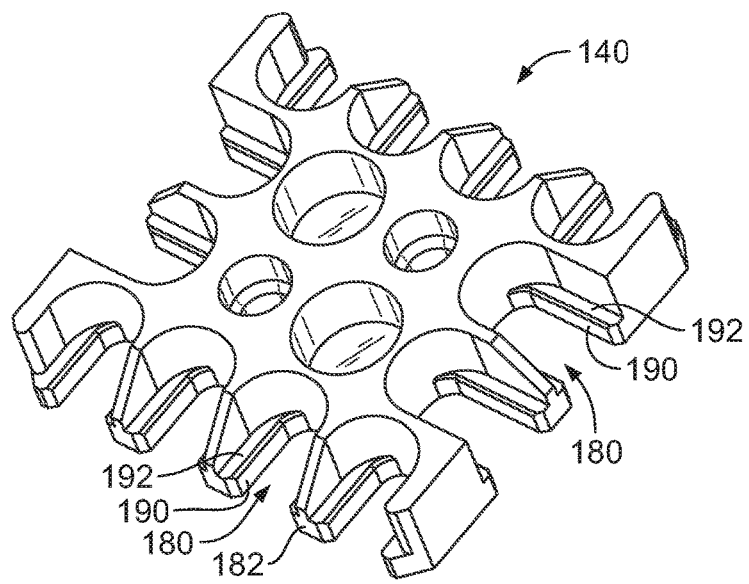
FIG. 12 is a front perspective view of the cover in accordance with an exemplary embodiment.

FIG. 12 is a front perspective view of the cover 140 in accordance with an exemplary embodiment. The cover 140 includes the openings 180 that receive corresponding coaxial contacts 500 (shown in FIG. 10). In the illustrated embodiment, the openings 180 are open to the outer section edge 182. More specifically, the openings 180 are defined by open-sided slots that provide access to the openings 180. The open-sided slots are sized and shaped to receive portions of the coaxial contacts 500. In an exemplary embodiment, the cover 140 includes flanges 190 along the openings 180. The flanges 190 have seating surfaces 192 that receive and support the corresponding washers 590.

Figure 13:
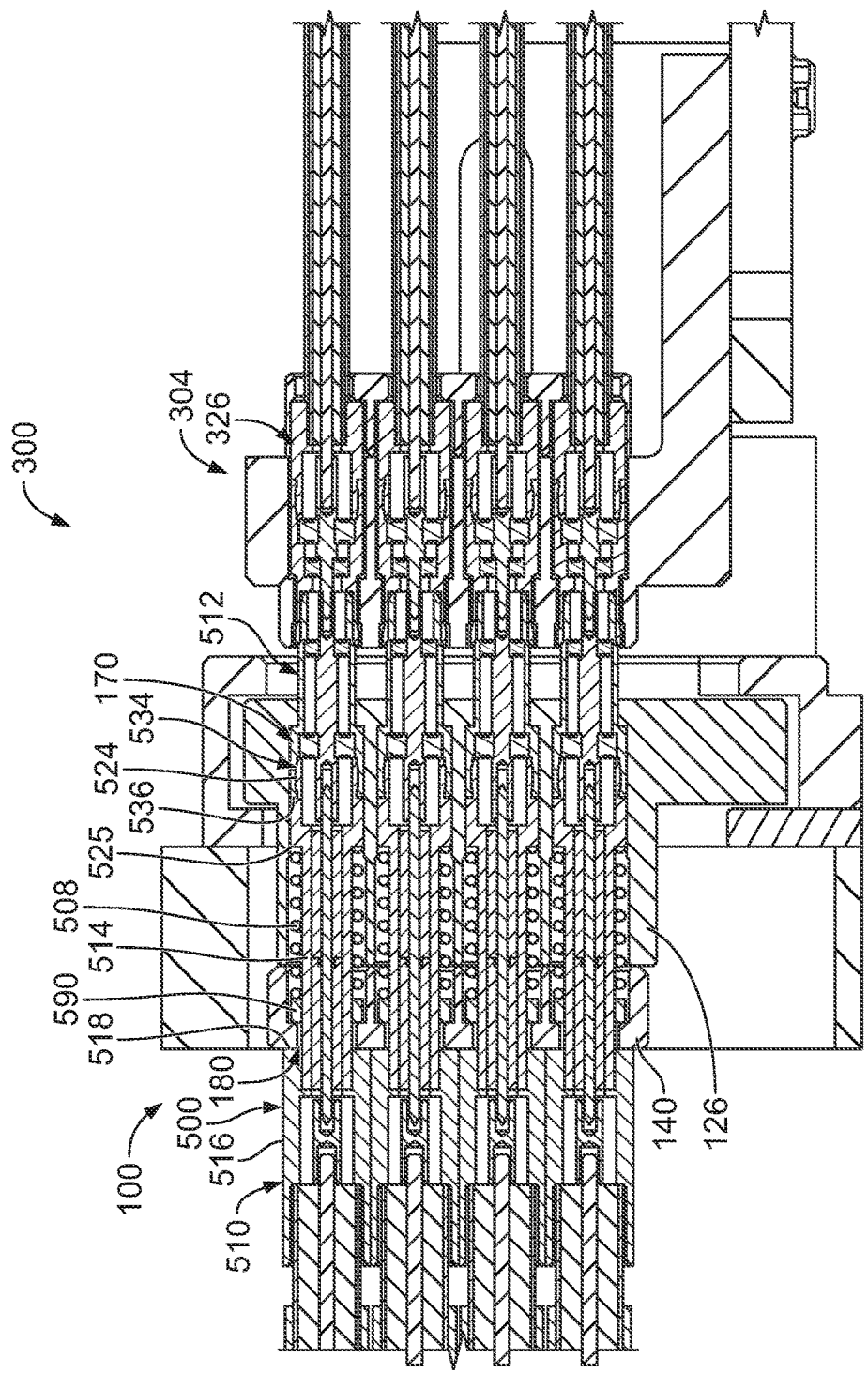
FIG. 13 is a cross-section of the communication system showing the coaxial connector assembly with the coaxial contacts mated with the daughter card assembly in accordance with an exemplary embodiment.

FIG. 13 is a cross-section of the communication system 300 showing the coaxial connector assembly 100 with the coaxial contacts 500 mated with the daughter card assembly 304. The coaxial contacts 500 are coupled to corresponding mating coaxial contacts 326. The coaxial contacts 500 are able to float in the contact cavities 170 using the biasing springs 508. The biasing springs 508 are compressed between the flange 525 and the washer 590. The washer 590 is coupled to the cover 140.

When assembled, the cable segment 510 is mechanically and electrically connected to the mating segment 512. The front section 514 of the cable segment 510 extends through the corresponding opening 180 in the cover 140 to mate with the mating segment 512, which is spaced apart from the cover 140. The front section 514 is coupled to the rear section 516, such as by a press fit connection. The front section 514 passes through the biasing spring 508 such that the plug end 524 is received in the bore 534 at the rear end 536 of the mating segment 512. In an exemplary embodiment, when the cable segment 510 is fully loaded into the connector body 126, the shoulder 518 abuts against the back end of the cover 140. For example, the biasing spring 508 may pull the cable segment 510 forward until the shoulder 518 abuts against the cover 140.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112(f), unless and until such claim limitations expressly use the phrase "means for" followed by a statement of function void of further structure.

What is claimed is:

1. A coaxial connector assembly comprising:
a connector module having a connector body that includes contact cavities extending between a front side and a rear side of the connector body, the front side facing in a mating direction along a mating axis, the connector module having a cover coupled to the rear side of the connector body, the cover having openings aligned with corresponding contact cavities;
a plurality of coaxial contacts received in corresponding contact cavities, each coaxial contact having a signal element and an outer contact being coaxial with the signal element and electrically isolated from the signal element by an insulator, the outer contact having a cable segment configured to be coupled to a corresponding coaxial cable and a mating segment presented along the front side of the connector body for engaging corresponding mating contacts of a mating connector, the cable segment having a front section and a rear section, the front section having a smaller diameter than the rear section, the rear section located rearward of the cover and receiving the cable, the front section passing through the corresponding opening in the cover into the corresponding contact cavity to engage the mating segment to mechanically and electrically connect the cable segment and the mating segment of the outer contact; and
biasing springs coupled to each of the coaxial contacts, the biasing springs being located between the cover and the mating segment of the corresponding coaxial contact to bias the coaxial contact in the mating direction.

2. The coaxial connector assembly of claim 1, wherein the biasing spring is coaxial with and outward of the front section of the cable segment of the corresponding coaxial contact.

3. The coaxial connector assembly of claim 1, wherein the mating segment includes a bore at a rear end of the mating segment, a plug end of the front section of the cable segment of the corresponding coaxial contact being received in the bore to mechanically and electrically connect the cable segment to the mating segment.

4. The coaxial connector assembly of claim 1, wherein the cable segment includes a shoulder between the front section and the rear section, the shoulder abutting against the cover.

5. The coaxial connector assembly of claim 1, wherein the front section is separate and discrete from the rear section and coupled thereto to mechanically and electrically connect to the front section and the rear section.

6. The coaxial connector assembly of claim 1, wherein the front section and the rear section are integral.

7. The coaxial connector assembly of claim 1, further comprising a mounting frame having a mating side and a mounting side that face in opposite directions, the mating side facing in the mating direction, the mounting side configured to interface with a support wall, the mounting frame defining a passage that extends therethrough between the mating and mounting sides, the passage including a connector-receiving recess defined by blocking surfaces, the connector receiving recess receiving the connector module in a loose fit to permit the connector module to float relative to the mounting frame within a confined space that is defined by the blocking surfaces.

8. The coaxial connector assembly of claim 1, further comprising a washer coupled to the front section, the washer having a front and a rear, the biasing spring engaging the front, the rear of the washer engaging the cover.

9. The coaxial connector assembly of claim 1, wherein the front section includes a flange, a front of the biasing spring engaging the flange and biasing the front section forward.

10. The coaxial connector assembly of claim 1, wherein the openings of the cover have a width, the width being narrower than a width of the coaxial cable.

11. The coaxial connector assembly of claim 1, wherein the openings of the cover are open to a corresponding edge of the cover, the front sections being side-loaded into the openings through the corresponding edge of the cover.

12. The coaxial connector assembly of claim 1, wherein the rear section has a first diameter, the front section has a second diameter, and a rear end of the mating segment has a third diameter, the second diameter being smaller than the first diameter and the third diameter, the third diameter being smaller than the first diameter.

13. The coaxial connector assembly of claim 1, wherein the coaxial contacts are arranged in a row, the rear sections of the coaxial contacts in the row having a first spacing, the front sections of the coaxial contacts in the row having a second spacing, rear ends of the mating segments of the coaxial contacts in the row having a third spacing, the second spacing being greater than the first spacing and the third spacing.

14. The coaxial connector assembly of claim 13, wherein the first spacing is zero or near-zero such that the rear sections abut against or nearly abut against each other.

15. The coaxial connector assembly of claim 13, wherein walls of the connector body defining the contact channels are located in the third spacing between adjacent coaxial contacts and wherein the walls of the connector body and the biasing springs are located in the second spacing between adjacent coaxial contacts.

16. A coaxial connector assembly comprising:
a connector module having a connector body that includes contact cavities extending between a front side and a rear side of the connector body, the front side facing in a mating direction along a mating axis, the connector module having a cover coupled to the rear side of the connector body;
a plurality of coaxial contacts received in corresponding contact cavities, each coaxial contact having a signal element and an outer contact coaxial with the signal element and electrically isolated from the signal element by an insulator, the outer contact having a cable segment configured to be coupled to a corresponding coaxial cable and a mating segment presented along the front side of the connector body for engaging corresponding mating contacts of a mating connector, the cable segment having a front section and a rear section, the front section having a smaller diameter than the rear section, the rear section receiving the cable, the front section passing through the cover into the corresponding contact cavity to plug into a bore of the mating segment to mechanically and electrically connect the cable segment and the mating segment of the outer contact; and
a mounting frame having a mating side and a mounting side that face in opposite directions, the mating side facing in the mating direction, the mounting side configured to interface with a support wall, the mounting frame defining a passage that extends therethrough between the mating and mounting sides, the passage including a connector-receiving recess defined by blocking surfaces, the connector receiving recess receiving the connector module in a loose fit to permit the connector module to float relative to the mounting frame within a confined space that is defined by the blocking surfaces.

17. The coaxial connector assembly of claim 16, further comprising biasing springs coupled to each of the coaxial contacts, the biasing springs located between the cover and the mating segment of the corresponding coaxial contact to bias the coaxial contact in the mating direction.

18. The coaxial connector assembly of claim 17, wherein the biasing spring is coaxial with and outward of the front section of the cable segment of the corresponding coaxial contact.

19. The coaxial connector assembly of claim 16, wherein the mating segment includes a bore at a rear end of the mating segment, a plug end of the front section of the cable segment of the corresponding coaxial contact being received in the bore to mechanically and electrically connect the cable segment to the mating segment.

20. The coaxial connector assembly of claim 16, wherein the cable segment includes a shoulder between the front section and the rear section, the shoulder abutting against the cover.

21. The coaxial connector assembly of claim 16, further comprising a washer coupled to the front section, the washer having a front and a rear, the biasing spring engaging the front, the rear of the washer engaging the cover.

22. A communication system comprising:
a mating coaxial connector assembly comprising a mating connector having a mating connector body that includes mating contact cavities extending between a front side and a rear side of the mating connector body, the mating contact cavities holding mating coaxial contacts, each mating coaxial contact having a mating signal element and a mating outer contact being coaxial with the mating signal element and electrically isolated from the mating signal element by an insulator; and
a coaxial connector assembly coupled to the mating coaxial connector assembly, the coaxial connector assembly comprising:
a connector module having a connector body that includes contact cavities extending between a front side and a rear side of the connector body, the front side facing in a mating direction along a mating axis, the connector module having a cover coupled to the rear side of the connector body, the cover having openings aligned with corresponding contact cavities;
a plurality of coaxial contacts received in corresponding contact cavities, each coaxial contact having a signal element configured to be mated with the mating signal element and an outer contact being coaxial with the signal element and electrically isolated from the signal element by an insulator, the outer contact having a cable segment configured to be coupled to a corresponding coaxial cable and a mating segment presented along the front side of the connector body for engaging the corresponding mating outer contacts of the mating coaxial connector assembly, the cable segment having a front section and a rear section, the front section having a smaller diameter than the rear section, the rear section located rearward of the cover and receiving the cable, the front section passing through the corresponding opening in the cover into the corresponding contact cavity to engage the mating segment to mechanically and electrically connect the cable segment and the mating segment of the outer contact; and
biasing springs coupled to each of the coaxial contacts, the biasing springs located between the cover and the mating segment of the corresponding coaxial contact to bias the coaxial contact in the mating direction, wherein the biasing springs allow the coaxial contacts to retract into the contact cavities during mating with the mating coaxial contacts.

23. The communication system of claim 22, wherein the biasing spring is coaxial with and outward of the front section of the cable segment of the corresponding coaxial contact.

24. The communication system of claim 22, wherein the mating segment includes a bore at a rear end of the mating segment, a plug end of the front section of the cable segment of the corresponding coaxial contact being received in the bore to mechanically and electrically connect the cable segment to the mating segment.

25. The communication system of claim 22, wherein the cable segment includes a shoulder between the front section and the rear section, the shoulder abutting against the cover.

26. The communication system of claim 22, further comprising a washer coupled to the front section, the washer having a front and a rear, the biasing spring engaging the front, the rear of the washer engaging the cover.

* * * * *